United States Patent [19]

Lin

[11] Patent Number: 6,036,875
[45] Date of Patent: Mar. 14, 2000

[54] METHOD FOR MANUFACTURING A SEMICONDUCTOR DEVICE WITH ULTRA-FINE LINE GEOMETRY

[75] Inventor: Ming-Ren Lin, Cupertino, Calif.

[73] Assignee: Advanced Micro Devices, Inc., Sunnyvale, Calif.

[21] Appl. No.: 08/802,738

[22] Filed: Feb. 20, 1997

[51] Int. Cl.$^7$ ..................................... C23F 1/00
[52] U.S. Cl. .............................. 216/51; 216/13; 438/720; 438/734; 438/738
[58] Field of Search .................. 216/13, 40, 42, 216/47, 51, 57; 438/704, 714, 720, 734, 738, 754; 430/316

[56] References Cited

U.S. PATENT DOCUMENTS

| | | | |
|---|---|---|---|
| 4,352,724 | 10/1982 | Sugishima et al. | 204/192 E |
| 4,990,218 | 2/1991 | Tezaki et al. | 156/627 |
| 5,045,150 | 9/1991 | Cleeves et al. | 156/643 |

OTHER PUBLICATIONS

Wolf, S. et al, "Silicon Processing for the VLSI Era—vol. 1: Process Technology", Lattice Press, Sunset Beach, CA, p. 526, Jan. 1986.

*Primary Examiner*—Richard Bueker
*Assistant Examiner*—Alva C Powell

[57] ABSTRACT

A method for ultra-fine patterning of a semiconductor device performs a first, anisotropic etching of a hard mask layer according to a pattern created by lithographic techniques to create lines in the hard mask layer having an initial width. A second, anisotropic etching is performed on the hard mask layer to narrow the lines further than otherwise possible with a single etching according to the patterns created by lithography. Using the narrowed lines created in the hard mask layer, a third, anisotropic etching is performed, this time on the conductor layer shadowed by the narrow lines of the hard mask layer. The third etching creates narrow lines in the conductor layer in accordance with the narrow lines of the hard mask layer.

6 Claims, 4 Drawing Sheets

METHOD FOR MANUFACTURING A SEMICONDUCTOR DEVICE WITH ULTRA-FINE LINE GEOMETRY

TECHNICAL FIELD OF THE INVENTION

The present invention relates to semiconductor devices, and in particular to fabrication of semiconductor circuits having a very fine feature size.

BACKGROUND OF THE INVENTION

Reducing the size of devices and circuits residing on semiconductor chips provides many advantages, such as allowing greater device density, increasing operating speed, reducing power losses, generating less heat, and enhancing portability. However, as devices become smaller and more closely spaced on a die, patterning the circuit connections between the devices, in a manner that takes full advantage of the small size of the devices, becomes more difficult. Closely spaced narrow lines are necessary, as the size and spacing of devices are reduced.

Photolithography permits fabrication of very fine metal lines to connect the devices on a substrate. Customarily, connections between devices are formed by depositing a conductor layer such as aluminum alloy or copper alloy on a substrate and using ordinary lithography to pattern a circuit. Unfortunately, however, the fineness of circuits produced by photolithography is limited by the wavelength of the radiation used.

Lithography generally includes a step of exposing a substrate layer (for example, metal) to radiation that has passed through a photo-mask that has itself been formed by lithography, to transfer a pattern from the photo-mask to the substrate layer. Although the size of the pattern can be reduced by optical and other means, the wavelength of the radiation used remains a fundamental limit to resolution in lithography. The width of the lines that can be patterned cannot be narrower than the wavelength used, when ordinary modem lithography is employed.

For this reason, lithography of circuits generally uses very short wavelengths, such as, deep-UV radiation, for circuit patterning. Deep-UV lithography involves patterning of substrates with circuits with various lines of the deep-UV spectrum, including the E, G, H, and I lines (having very short wavelengths of 546 nm, 436 nm, 405 nm, and 365 nm, respectively). The I line of the deep-UV band allows a minimum feature size of approximately 248 nm (2480 Å, or "quarter micron"). However, even this extremely fine resolution is not satisfactory for the narrower patterns that would take full advantage of the size reduction in semiconductor devices themselves.

It is possible to obtain greater resolution by using shorter wavelengths, but the resists and technologies that are matched to such shorter wavelengths present difficulties that make them unsuitable or too costly for lithographic applications. Many resists cannot withstand the stresses created during lithography, and plasma or ion-beam etching can remove or degrade resists. Moreover, many semiconductor device fabrication technologies (for example excimer lasers) are difficult to use, expensive, suffer from optical aberrations, and require frequent maintenance. Finally, even if equipment and resists could be found for the shorter wavelengths, the tremendous existing investment for present lithographic technologies would make a complete overhaul of such technologies impractical.

Another approach to reducing device size by increasing the resolution of photolithography is optical refraction. Optical refraction in lithography relies on overlapping patterns of constructive and destructive interference created as radiation passes through slots or gaps. In mask photolithography, optical refraction can be produced in either bright-field or dark-field masks by placing slots in different mask regions located near one another. The patterns of interference emerging from the mask show points of constructive and destructive interference. Refractive methods also include placing an additional mask layer, which is transparent and phase-shifting to the wavelength used, on the bottom or top of the mask at certain locations and not at other locations, thereby moving the constructive and destructive interference patterns according to the pattern desired. The material used needs to be matched to the resist and to the wavelength, and can be difficult to align. Such techniques also suffer from difficulties when the pattern of the circuit to be imaged is highly irregular. Also, adjacent areas of constructive interference are often seen as a single large region, and are not resolved in some cases.

SUMMARY OF THE INVENTION

There is a need for a method and apparatus for creating finer resolution images, while employing the technical knowledge and available materials pertaining to existing technologies. The approach should not significantly raise costs, and should be applicable to a wide range of wavelengths.

These and other needs are met by embodiments of the present invention which provide a process for ultra-fine patterning of a semiconductor device, the process comprising the steps of depositing a mask layer on a first layer, such as a conductor layer. A photo-masking material is spun on the mask layer and patterned by conventional lithographic techniques, for example. A first etching is performed to etch the mask layer in accordance with the pattern of the photo-masking material to form lines in the mask layer having an initial width d. This first etching is an anisotropic etching, such as RIE etching, in certain embodiments. A second etching is then performed to etch the mask layer to narrow the lines in the mask layer to have a reduced width d'. This second etching is an isotropic etching in certain embodiments of the invention. With the multiple etchings performed on the mask layer to create mask layer lines that are narrower than otherwise possible using a single etching following conventional lithography of the photo-masking material, a third etching is performed after removal of the photo-masking material to etch the first layer to create lines in the first layer having a width of approximately d'. The third etching is an anisotropic etching, in certain embodiments, with the narrowed lines in the mask layer shadowing the first layer, and allowing the third etching to create the narrow lines in the first layer.

In certain embodiments of the invention, a fourth etching is performed with the mask layer in place to further narrow the lines in the first layer. This fourth etching is an isotropic etch, for example.

The earlier stated needs are also met by another embodiment of the present invention which provides a semiconductor device that is formed according to the process described above.

In the embodiments of the invention, the extremely narrow lines in the first mask layer are subsequently used to mask the conductor layer during etching of the conductor layer, by a reactive ion etch, for example. An etch bias can be further applied to reduce the constructive width during the conductor etch by an etch process which reduces the metal to the final desired dimension.

The present invention produces ultra-fine lines than can be produced by conventional lithographic techniques by providing an additional etching (such as isotropic etching) of the material in the mask layer. This overcomes the limitations on narrowness imposed on the conventional techniques due to wavelength considerations, in an efficient and elegant manner. The multiple step etching of the mask layer according to the present invention provides a more controllable width reduction than processes that attempt to reduce the width in a single step.

The foregoing and other features, aspects and advantages of the present invention will become more apparent from the following detailed description of the present invention when taken in conjunction with the accompanying drawings.

DETAILED DESCRIPTION OF THE DRAWINGS

In the following description, for purposes of explanation, numerous specific details are set forth in order to provide a thorough understanding of the present invention. It will be apparent, however, to one skilled in the art that the present invention may be practiced without these specific details. In other instances, well-known structures and devices are shown in block diagram form in order to avoid unnecessarily obscuring the present invention.

Figure 1:
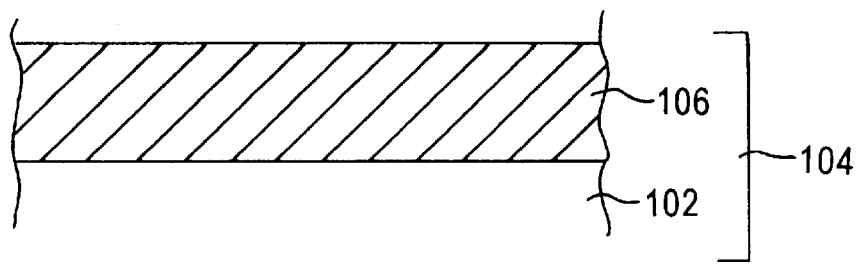
FIG. 1 is a sectional view of a substrate layer having a conductor layer, according to certain exemplary embodiments of the present invention.

Referring to FIG. 1, initially, an insulator layer 102 is selected. On top of the insulator layer 102, a conductor layer 106 is provided. Different materials may be used to for the conductor layer 106, such as metal, metal alloys, doped polysilicon, etc. Although the invention has particular utility with forming narrow conductors, this is exemplary only. As will be apparent from the following description, the layer 106 does not have to be a conductor layer, and could be another type of layer, such as an insulator layer.

Figure 2:
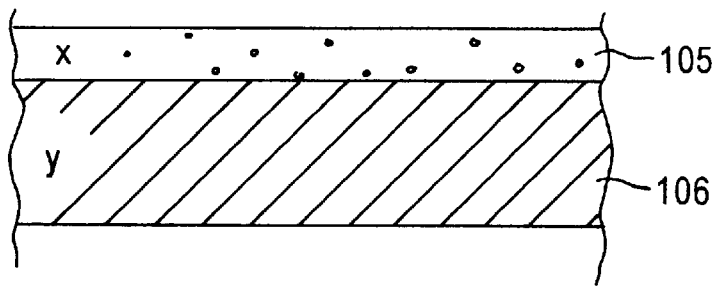
FIG. 2 depicts a substrate layer having a conductor layer covered by a hard mask, according to certain exemplary embodiments of the present invention.
Figure 3:
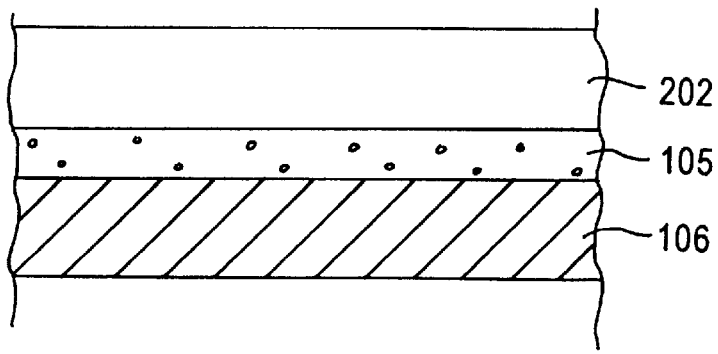
FIG. 3 depicts a substrate layer having a conductor layer covered by both a hard mask and a photo-mask material, according to certain exemplary embodiments of the present invention.
Figure 4:
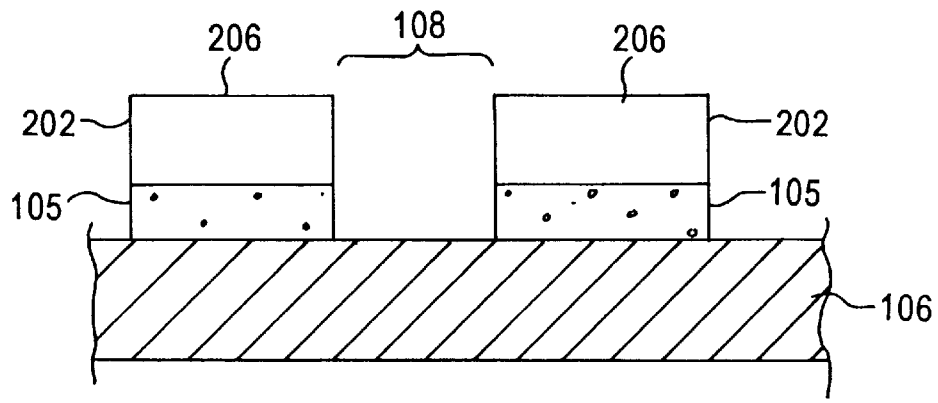
FIG. 4 depicts a substrate layer having a conductor layer covered by both a patterned hard mask and a patterned photo-mask material, according to certain exemplary embodiments of the present invention.

Two exemplary embodiments of the method according to the present invention for forming strips are now described. As shown in FIG. 2, a hard mask layer 105 is deposited over the conductor layer 106. In preferred embodiments, the hard mask layer 105 is made of a material having a high etch selectivity with respect to the conductor layer 106. For example, the hard mask layer 105 may have an etch selectivity of 10-to-1 with respect to the conductor layer 105. Examples of suitable hard mask materials include titanium-nitride and oxide. After the hard mask layer 105 is deposited, a conventional masking process is carried out. The subsequent masking process includes spinning a photo-masking material 202 over the hard mask layer 105 (FIG. 3), and patterning of the photo-masking material 202 by conventional lithographic techniques. Following the patterning of the photo-masking material 202, a first etching is performed in the hard mask layer 105, to define a pattern in the hard mask layer 105 according to the pattern in the photo-masking material 202. As depicted in FIG. 4, the pattern imposed by the lithography defines line traces 206, and also slots or gaps 108. The etching may be performed in different manners, with reactive ion etching (RIE) providing a preferred technique. As seen by the pattern created in FIG. 4 in the hard mask layer 105, the first etching is an anisotropic etching in preferred embodiments of the invention.

FIGS. 1–4 depict steps in the processing of devices according to both the first and second exemplary embodiments of the present invention. It will be apparent that the structure of FIG. 4 is readily obtained using presently available technology and materials.

Figure 5:
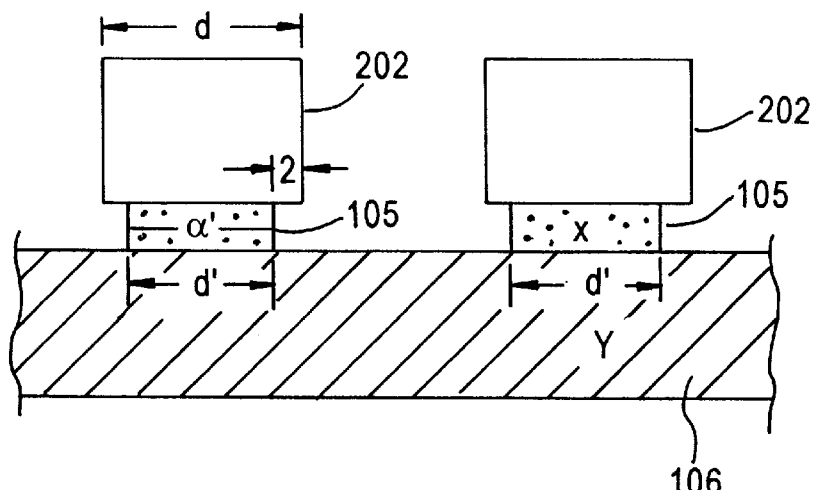
FIG. 5 depicts the structure of FIG. 4 after an etching step of a first exemplary embodiment of the present invention.

In the first exemplary embodiment, after the pattern of FIG. 4 is defined by the conventional etching, a second etching is performed to etch into and remove additional material from the hard mask layer 105 through the slots or gaps 108 in the photo-masking material 202. This etching may be, for example, an isotropic etch. The etch rate may be, for example, approximately 100 Å per minute. Thus, as seen in FIG. 5, if the initial width of a line was d after the first etching, the final width of the line after the second etching is reduced to d', where d' is less than d. The difference between d and d' depends on the length of time during which the isotropic etch is allowed to proceed. The photo-masking material 202 is either unaffected or is less affected than the hard mask layer 105 by the isotropic etch. In this embodiment of the present invention, the photo-masking material 202 ensures that the isotropic etching of the hard mask layer 105 does not reduce the height of the hard mask layer 105. The resulting structure after the second etching (e.g., isotropic etching) in the first exemplary embodiment is depicted in FIG. 5.

Figure 9:
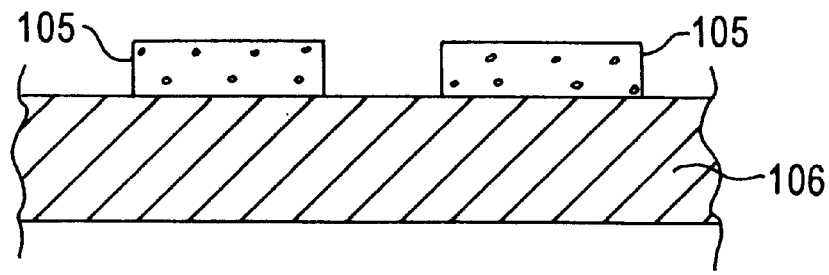
FIG. 9 depicts the structure of FIG. 4 after the photo-mask layer has been removed according to the second exemplary embodiment of the present invention.

In the second exemplary embodiment, by contrast, the photo-masking material 202 is removed after the pattern is defined in the hard mask layer 105 by the first etching and prior to the second etching. The resulting structure after removal of the photo-masking material 202 is depicted in FIG. 9. Thereafter, a second etch is performed to etch into and remove material from the upper surface in addition to the side surfaces of the hard mask layer 105. The second etch is an isotropic etch in certain embodiments, although other types of etches are contemplated, including separate etches to reduce both dimensions of the hard mask layer 105. An exemplary etch rate is approximately 100 Å per minute. Thus, if the initial width of a line was d after the first etch, the final width of that line after the second etch is d', where d' is less than d. The difference between d and d' depends on the length of time during which the isotropic etch is allowed to proceed. The isotropic etching of the hard mask layer 105 thins and narrows the hard mask layer 105 without adversely affecting the conductor layer 106. The second etch therefore produces small deposits of the hard mask layer 105 that are far narrower than the wavelength of the radiation used in the initial lithographic step. The resulting structure after the isotropic etching in the second exemplary embodiment is shown in FIG. 10.

Figure 6:
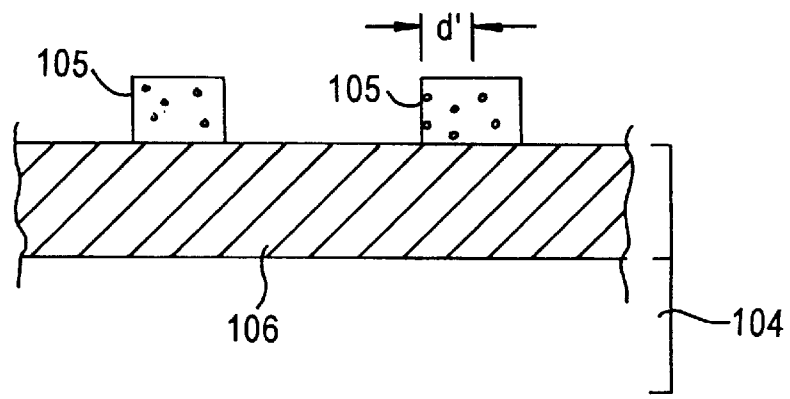
FIG. 6 depicts the structure of FIG. 5 after a photo-mask layer has been removed according to the first exemplary embodiment of the present invention.
Figure 10:
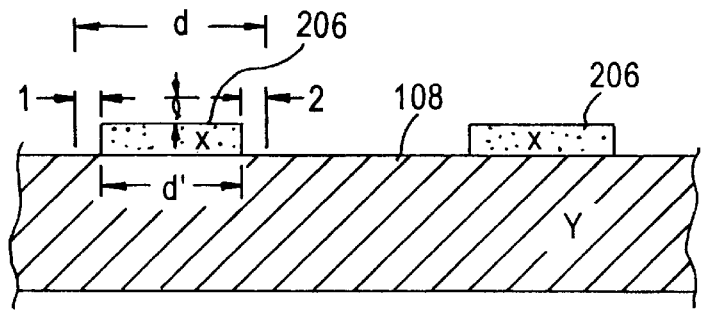
FIG. 10 depicts the structure of FIG. 9 after an etching step, according to the second exemplary embodiment of the present invention.

The second etching in both the first and second embodiments results in a pattern on the hard mask layer 105 that has line traces 206 of arbitrary narrowness, as depicted in FIGS. 6 and 10. The narrowness of the line traces 206 can be controlled by timing of the second etch with a high degree of precision when the etch rate is known precisely. As depicted in FIG. 5, the hard mask layer 105 is therefore etched with a pattern having narrower lines than would have been possible with only a single etching step. The conductor layer 106 is substantially unaffected, since the isotropic etch of the hard mask layer 105 is very selective toward the conductor layer 106. Also, because the hard mask layer 105 is covered with the photo-mask layer 202 in the first embodiment of the invention, the remaining deposits of hard mask layer 105 retain most or substantially all of their original profile thickness, but comprise narrow lines of hard mask layer 105 that are narrower than would otherwise have been possible. The photo-masking material 202 is then removed. The resulting structure after removal of the photo-masking material 202 is depicted in FIG. 6.

As shown in FIGS. 6 and 10, the methods according to the exemplary embodiments of the present invention produce extremely narrow lines that are not achievable using lithography alone, yet can be produced using the technical knowledge and available materials pertaining to existing technologies. Although described as applicable to the I-line of deep-UV lithography, it will be apparent upon reference to the present disclosure that the present invention is applicable to enhance lithography of any wavelength.

Figure 7:
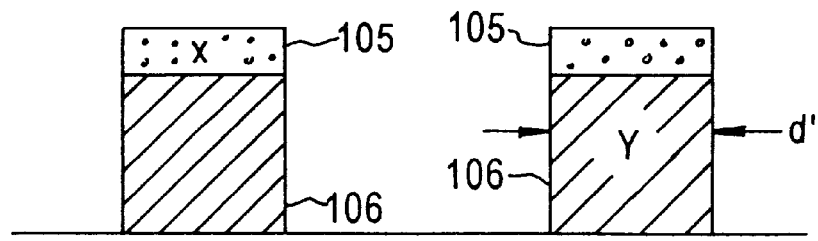
FIG. 7 depicts the structure of FIG. 6 after RIE etching of the conductor layer according to the first exemplary embodiment.
Figure 8:
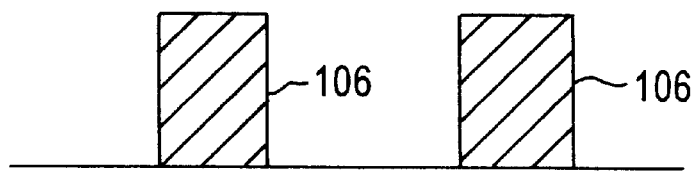
FIG. 8 depicts the structure of FIG. 7 after RIE etching of the conductor layer and removal of the hard mask layer, according to the first exemplary embodiment.
Figure 11:
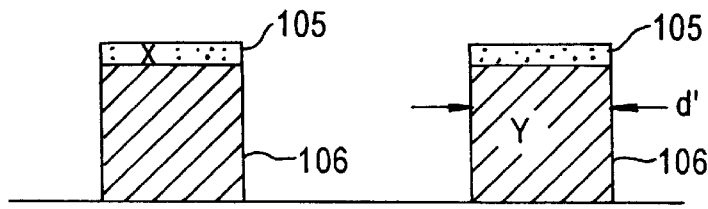
FIG. 11 depicts the structure of FIG. 10 after RIE etching of the conductor layer according to the second exemplary embodiment of the present invention.
Figure 12:
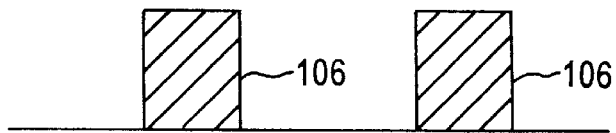
FIG. 12 depicts the structure of FIG. 11 after the hard mask layer is optionally removed, according to the second exemplary embodiment of the present invention.

After the second etching, in both the first and second embodiments, a third etching step is performed. In certain embodiments, this third etching is an anisotropic etching (such as RIE etching) of the underlying conductor layer 106 through the opening in the hard-mask layer 105. The conductor layer 106 of the substrate layer 102 is highly sensitive to the third etch. An anisotropic etching of the conductor layer 106 leaves extremely narrow conductor lines in the conductor layer 106 of the die 104, since they are shadowed from the anisotropic etching by the extremely narrow lines of remaining deposits of hard mask layer 105. For the first exemplary embodiment, the structure resulting after the etching of the conductor layer 106 is depicted in FIG. 7. For the second exemplary embodiment, the structure resulting after the etching of the conductor layer 106 is depicted in FIG. 11. After the third etching is completed, the hard mask layer 105 is removed in certain embodiments, although it remains in other embodiments. For the first exemplary embodiment, the resulting structure after the hard mask layer 105 is removed is shown in FIG. 8, and for the second exemplary embodiment, in FIG. 12.

Figure 13:
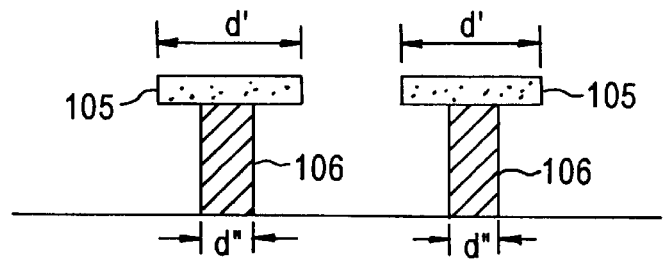
FIG. 13 depicts the structures of FIGS. 7 and 11 after an additional etching step is performed according to another embodiment of the present invention to further reduce the width of the lines in the conductor layer.

In still further embodiments of the present invention, a fourth etch is performed following the formation of the lines in the conductor layer 106 by the third etch, as depicted in FIGS. 7 and 11. In these embodiments, the fourth etch reduces the width of the narrow lines still further, as depicted in FIG. 13. The width of the lines is reduced, for example, from d' to d". The fourth etch is an isotropic etch in certain embodiments, although other types of etches are contemplated.

The exemplary embodiments of the present invention provide an ultra-fine geometry and narrower lines, as the masking material is formed into narrower lines than in the prior art by the conventional lithography methods. This is accomplished by first employing the conventional lithography, followed by a first etching to form lines in the masking layer. A second, isotropic etching of the masking layer further narrows these lines. Thus, the second etching of the masking layer provides narrower lines than that achievable by the conventional methods alone, as well as providing a better control of the width of the lines.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. A process for ultra-fine patterning of a semiconductor device, the process comprising:

depositing a mask layer of a mask material on a first layer;

placing a photo-masking material on the mask layer and patterning the photo-masking material to have lines of photo-masking material of width d;

performing an anisotropic etching to etch the mask layer in accordance with the pattern of the photo-masking material to form lines of mask material having the width of d;

performing an isotropic etching to etch the lines of mask material, after said isotropic etching, the lines of mask material each having a width of d', less than d;

removing the photo-masking material; and performing a third etching with the lines of mask material to etch the first layer to create lines in the first layer having a width of approximately d'.

2. The process of claim 1, wherein the third etching is an anisotropic etching.

3. The process of claim 1, further comprising performing a fourth etching to etch the first layer and narrow the lines in the first layer to a width of d", where d" is less than d'.

4. The process of claim 3, wherein the step of patterning the photo-masking material includes lithographic patterning.

5. The process of claim 1, further comprising removing the photo-masking material from the mask layer prior to performing the second etching.

6. The process of claim 3, wherein the fourth etching is an isotropic etching.

* * * * *